(12) United States Patent
Langheinrich et al.

(10) Patent No.: US 12,029,142 B2
(45) Date of Patent: Jul. 2, 2024

(54) QUANTUM CONVEYOR AND METHODS OF PRODUCING A QUANTUM CONVEYOR

(71) Applicant: Infineon Technologies Austria AG, Villach (AT)

(72) Inventors: Wolfram Langheinrich, Dresden (DE); Claus Dahl, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 340 days.

(21) Appl. No.: 17/577,808

(22) Filed: Jan. 18, 2022

(65) Prior Publication Data
US 2023/0232725 A1 Jul. 20, 2023

(51) Int. Cl.
| | |
|---|---|
| H01L 29/66 | (2006.01) |
| H10N 60/01 | (2023.01) |
| H10N 60/10 | (2023.01) |
| H10N 69/00 | (2023.01) |
| G06N 10/40 | (2022.01) |

(52) U.S. Cl.
CPC ............ *H10N 69/00* (2023.02); *H10N 60/01* (2023.02); *H10N 60/11* (2023.02); *H10N 60/128* (2023.02); *G06N 10/40* (2022.01)

(58) Field of Classification Search
CPC .......................... G06N 10/40; H01L 29/66977
See application file for complete search history.

(56) References Cited

U.S. PATENT DOCUMENTS

| | | | | |
|---|---|---|---|---|
| 2020/0161456 | A1* | 5/2020 | Leipold | H01L 27/088 |
| 2020/0176569 | A1* | 6/2020 | Singh | H01L 29/66977 |
| 2021/0036110 | A1* | 2/2021 | Thomas | H01L 29/66977 |
| 2022/0077221 | A1* | 3/2022 | Jain | H01L 27/092 |
| 2022/0262968 | A1* | 8/2022 | Baik | H01L 31/1126 |

OTHER PUBLICATIONS

Mills, A.R., et al., "Shuttling a Single Charge Across a One-Dimensional Array of Silicon Quantum Dots", Nature Communications 10, 2019.
Schreiber, Lars, et al., "Long-range quantum bus for electron spin qubits in silicon", SiQuBus, Jara Institute Quantum Information, accessed online at https://www.quantera.eu/images/SiQuBus.pdf on Feb. 25, 2020.

* cited by examiner

*Primary Examiner* — Jae Lee
(74) *Attorney, Agent, or Firm* — Murphy, Bilak & Homiller, PLLC

(57) ABSTRACT

A method of producing a quantum conveyor includes: forming a pair of screening gate electrodes in or on a semiconductor substrate and that extend between a first stationary quantum dot and a second stationary quantum dot, the pair of screening gate electrodes configured to delimit a channel of moveable quantum dots between the first stationary quantum dot and the second stationary quantum dot; forming, via a lithography process, a plurality of first planar transfer electrodes above the semiconductor substrate and that extend transverse to the channel of moveable quantum dots; and forming, via a self-aligned damascene process, a plurality of second planar transfer electrodes laterally interleaved with the first planar transfer electrodes, wherein the first planar transfer electrodes and the second planar transfer electrodes are configured to transfer quantum information between the first stationary quantum dot and the second stationary quantum dot through the channel of moveable quantum dots.

20 Claims, 16 Drawing Sheets

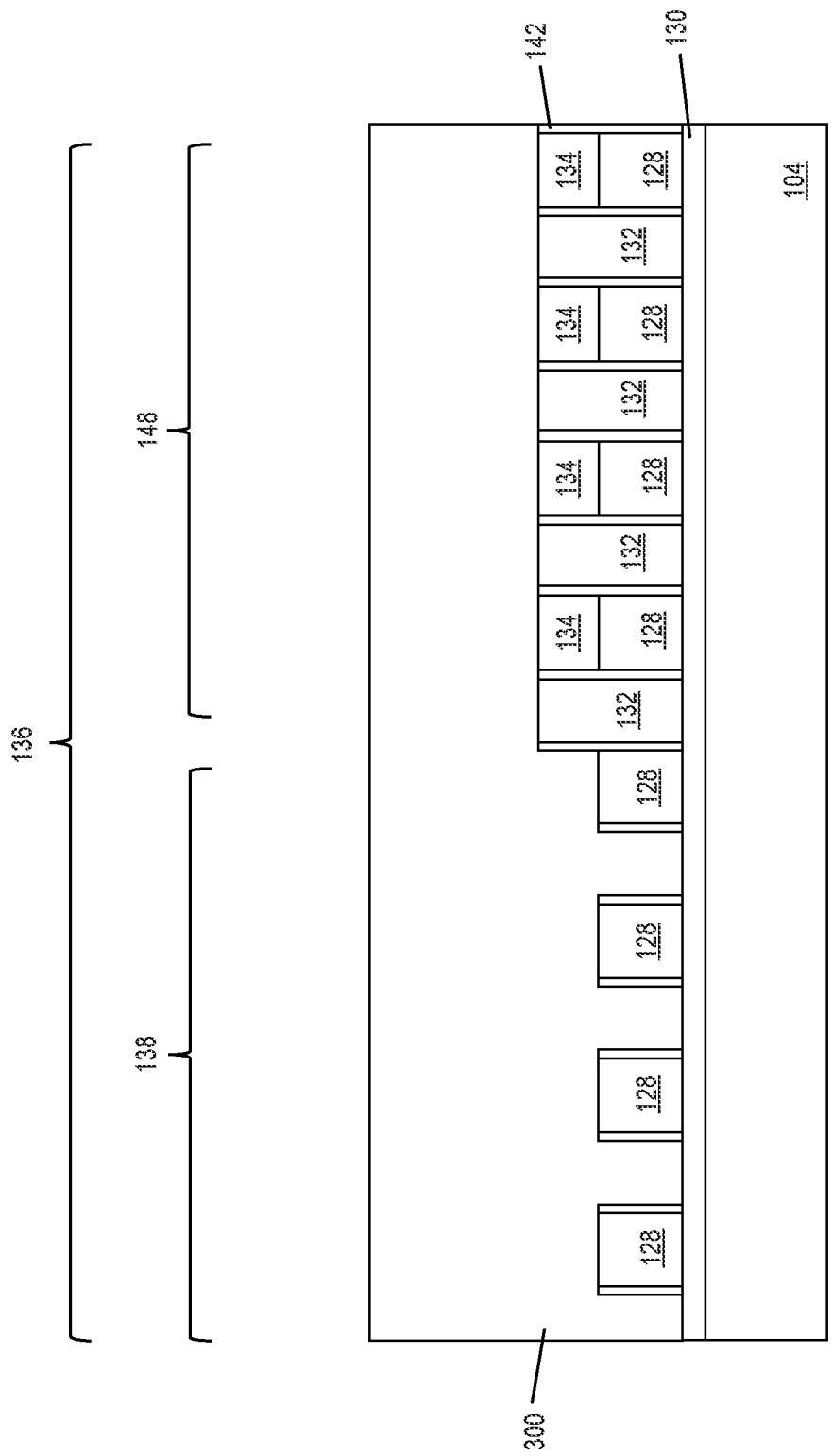

QUANTUM CONVEYOR AND METHODS OF PRODUCING A QUANTUM CONVEYOR

BACKGROUND

The basic element of a quantum computer is the so-called qubit or quantum bit. A qubit is the basic unit of quantum information. Stationary qubits may be conveyed using quantum dots. A quantum dot is a physical realization in a semiconductor substrate that uses electrodes to apply voltage potentials in a way that generates a potential valley that can trap an electron, the spin of which can be used to form a qubit. The qubit can be moved by phase-altering the potentials applied to the electrodes, thereby moving the potential valley. This type of quantum dot—with a moving potential valley—is commonly referred to as a flying qubit. Quantum computers typically require thousands, millions or even billions of qubits, and interconnections to the qubit chip (die) are needed to control the quantum state of the qubits contained therein.

Multiple gates are typically used to form and control quantum dots. Two or more gates form barriers for confining a quantum dot, where negative potentials are applied to make tunneling barriers. Hence, a two-dimensional electron gas is constricted to form a quantum dot (zero-dimensional electron gas). A third gate, commonly referred to as a plunger gate, is in between the barriers and used to control the potential of the quantum dot resulting, for instance, in electron depletion (negative) or accumulation (positive). By appropriate control of the gate potentials, quantum dots may be used to convey quantum information from one stationary qubit to another stationary qubit dot using flying qubits, thus moving quantum information between stationary qubits.

Because quantum information needs to be transferred between stationary qubits over a certain distance, a key challenge, besides the required large number of qubits, is their connectivity via a quantum conveyor. A quantum conveyor forms links between stationary qubits, effectively enabling transfer of flying (non-stationary) qubits via a chain of quantum dots over the length of the quantum conveyor.

Quantum dot structures are typically formed using electron beam (e-beam) lift-off techniques. A quantum conveyor is typically realized as follows. Initially, a quantum well is depleted using two gates, separated by a narrow gap, thereby forming the channel (quantum wire). Alternatively, the channel or quantum wire may be formed by etching. Subsequently, an array of gates, perpendicular to the quantum wire, then defines the chain of quantum dots. To transfer an electron and its spin state between stationary qubits, the potentials applied to the gates of the quantum dot array, which alternate between barrier and plunger gates with the barrier gates at negative potential and the plunger gates at positive potential, are phase-altered. The electron is located at the plunger electrodes while moving along the chain. Moving occurs, if the potential of the adjacent barrier is switched to positive while the plunger electrode becomes negative, hence the plunger and barrier potentials are reversed like a bucket brigade device. In a Si-based system, this implies a relatively tight gate pitch of roughly 40 nm which comes from the ability to control the tunnel barriers, which in turn depends on the effective mass of the electrons. This requires two separate electron-beam (e-beam) lithography and lift-off steps with very tight overlay. The spacing between adjacent gates is adjusted by an oxide deposition, having the advantage of tight control of the local potentials at the quantum well. However, such an e-beam and lift-off approach lacks reproducibility and the resulting quantum conveyor will be unable to connect a large number of qubits.

Thus, there is a need for an improved quantum conveyor structure and corresponding methods of production.

SUMMARY

According to an embodiment of a method of producing a quantum conveyor, the method comprises: forming a pair of screening gate electrodes in or on a semiconductor substrate and that extend between a first stationary quantum dot and a second stationary quantum dot, the pair of screening gate electrodes configured to delimit a channel of moveable quantum dots between the first stationary quantum dot and the second stationary quantum dot; forming, via a lithography process, a plurality of first planar transfer electrodes above the semiconductor substrate and that extend transverse to the channel; and forming, via a self-aligned damascene process, a plurality of second planar transfer electrodes laterally interleaved with the first planar transfer electrodes, wherein the first planar transfer electrodes and the second planar transfer electrodes are configured to transfer quantum information between the first stationary quantum dot and the second stationary quantum dot through the channel of moveable quantum dots.

According to an embodiment of a method of contacting a quantum conveyor that includes a pair of screening gate electrodes in or on a semiconductor substrate and configured to delimit a channel of moveable quantum dots between a first stationary quantum dot and a second stationary quantum dot, and first planar transfer electrodes laterally interleaved with second planar transfer electrodes above the semiconductor substrate and configured to transfer quantum information between the first stationary quantum dot and the second stationary quantum dot through the channel of moveable quantum dots, the second planar transfer electrodes being coplanar with a hard mask formed on the first planar transfer electrodes, the method comprises: in a first part of a contact region of the quantum conveyor that does not include the channel, removing the second planar transfer electrodes and the hard mask and subsequently forming first contacts to the first planar transfer electrodes; and in a second part of the contact region of the quantum conveyor, forming second contacts on the hard mask and that contact the second planar transfer electrodes.

According to an embodiment of a quantum conveyor, the quantum conveyor comprises: a pair of screening gate electrodes in or on a semiconductor substrate and that extend between a first stationary quantum dot and a second stationary quantum dot, the pair of screening gate electrodes configured to delimit a channel of moveable quantum dots between the first stationary quantum dot and the second stationary quantum dot; a plurality of first planar transfer electrodes above the semiconductor substrate and that extend transverse to the channel; and a plurality of second planar transfer electrodes laterally interleaved with the first planar transfer electrodes, wherein the first planar transfer electrodes and the second planar transfer electrodes are configured to transfer quantum information between the first stationary quantum dot and the second stationary quantum dot through the channel of moveable quantum dots.

According to an embodiment of a quantum conveyor, the quantum conveyor comprises: a pair of screening gate electrodes in or on a semiconductor substrate and configured to delimit a channel of moveable quantum dots between a first stationary quantum dot and a second stationary quantum dot; and first planar transfer electrodes laterally interleaved with second planar transfer electrodes above the semiconductor substrate and configured to transfer quantum information between the first stationary quantum dot and the second stationary quantum dot through the channel of moveable quantum dots, wherein the second planar transfer electrodes are coplanar with a hard mask formed on the first planar transfer electrodes, wherein in a first part of a contact region of the quantum conveyor that does not include the channel, the second planar transfer electrodes and the hard mask are removed and first contacts are provided to the first planar transfer electrodes, wherein in a second part of the contact region of the quantum conveyor, second contacts are formed on the hard mask and contact the second planar transfer electrodes.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 8A through 8D illustrate partial cross-sectional views of another embodiment of forming contacts to planar transfer electrodes in a contact region of the quantum conveyor.

DETAILED DESCRIPTION

Described herein is an improved quantum conveyor for quantum chips (dies) and corresponding methods of production. The gates of the quantum conveyor used to form a chain of moveable quantum dots configured to transfer stationary qubits (quantum bits) for conveying quantum information between stationary quantum dots are fabricated with a narrow pitch, e.g., of approximately 40 nm or less. Such a narrow pitch is produced using a single lithographic process step. The single lithography step can be used with a doubled pitch (e.g., of about 80 nm) for definition of a first gate electrode array. A second gate electrode array interleaved with the first gate electrode array is then fabricated in a self-aligned manner, e.g., using a damascene scheme. The resulting gate array of the quantum conveyor provides precise electrical control while providing for the connection of a large number of stationary qubits, and has a pitch (e.g., of about 40 nm) between adjacent first and second gate electrodes that is fine enough for acceptable quantum dot definition. A contact scheme is also described for contacting the arrayed gate electrodes, where the contact pitch can be further relaxed, e.g., to about 160 nm or greater for the 40 nm pitch example given above. Hence, conventional lithography such as dry ArF (positive tone 193 nm dry photoresist) can be used while still being able to reliably contact the dense array of gates.

Described next, with reference to the figures, are exemplary embodiments of the quantum conveyor and corresponding methods of production.

Figure 1:
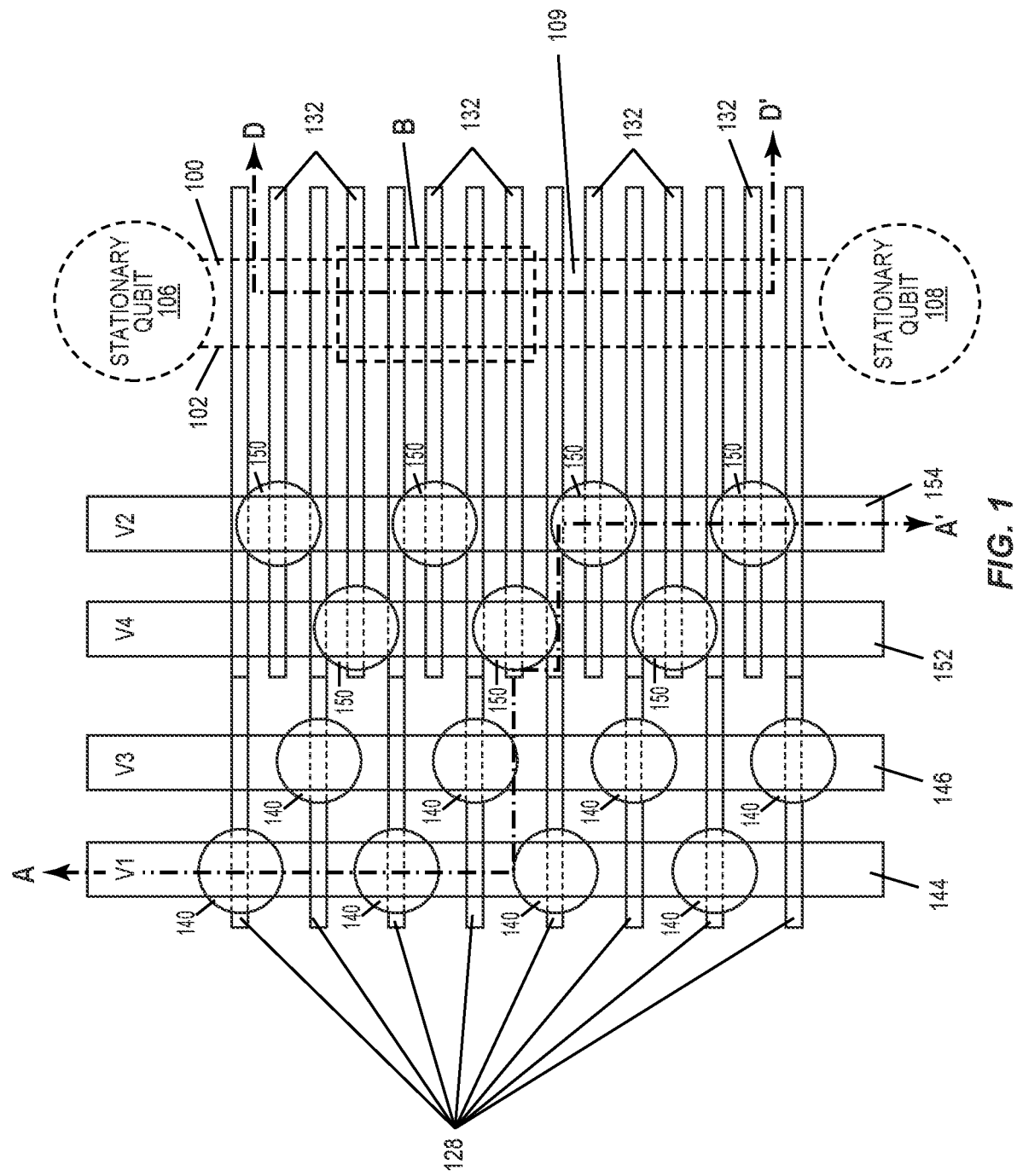
FIG. 1 illustrates a partial plan view of an embodiment of a quantum conveyor of a quantum chip.
Figure 2:
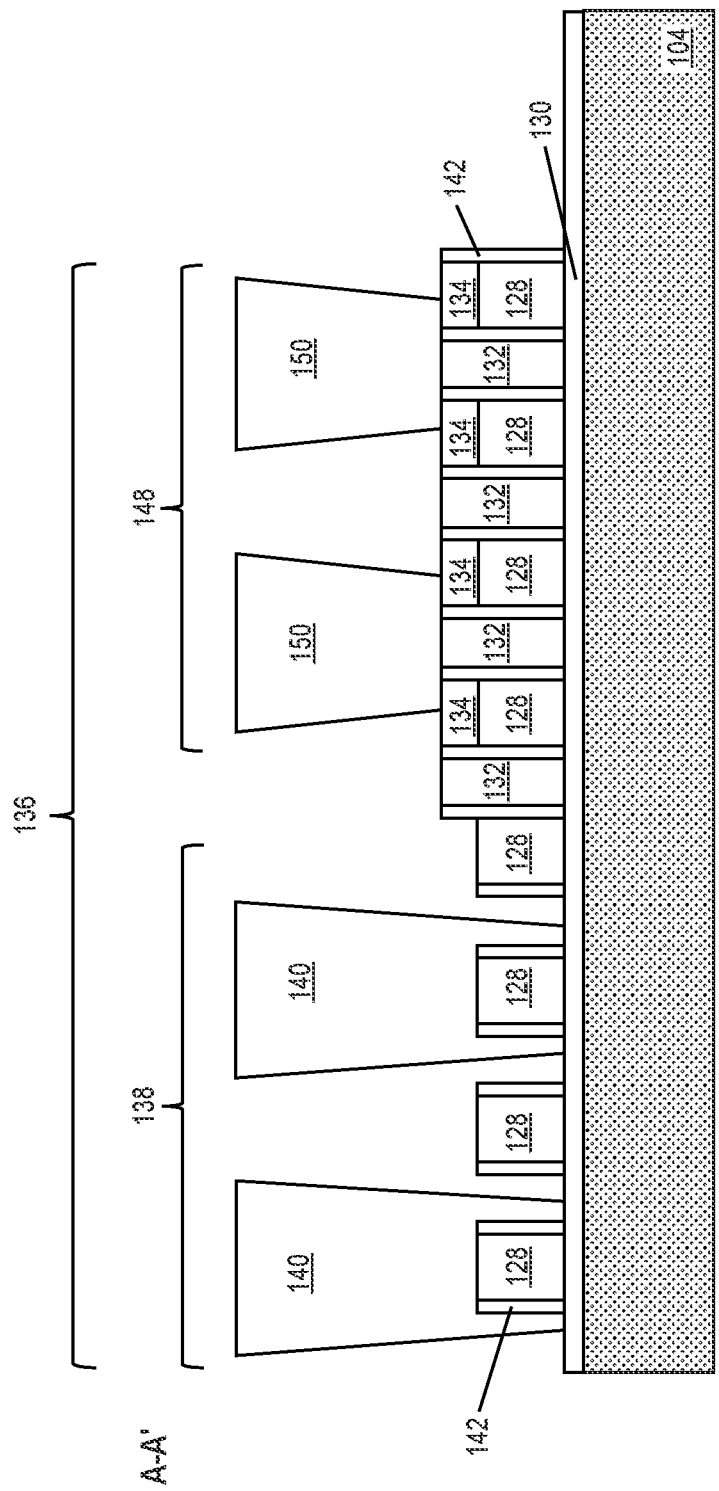
FIG. 2 illustrates a cross-sectional view of the quantum conveyor along the line labeled A-A' in FIG. 1.
Figure 4:
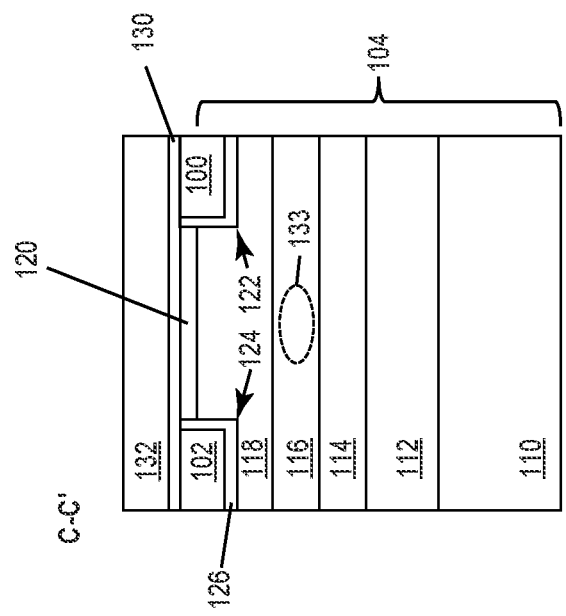
FIG. 4 illustrate a cross-sectional view of the quantum conveyor along the line labeled C-C' in FIG. 3.
Figure 3:
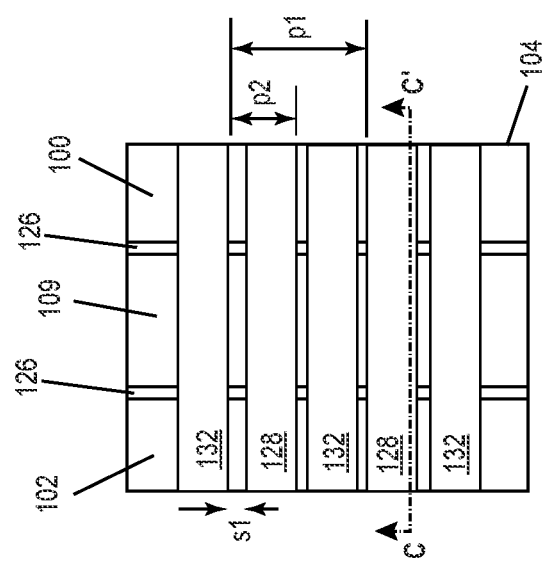
FIG. 3 illustrates a plan view of the quantum conveyor which shows a different level of detail for the region of the quantum conveyor included in the dashed box labeled 'B' in FIG. 1.
Figure 5:
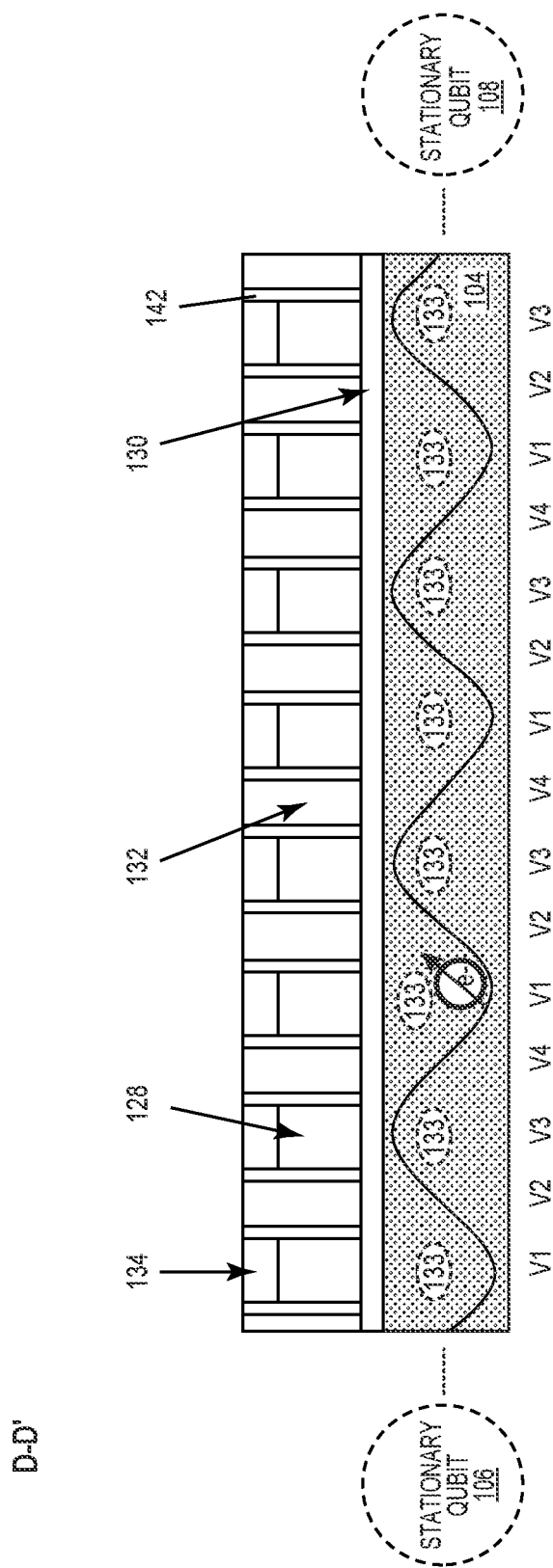
FIG. 5 illustrates a cross-sectional view of the quantum conveyor along the line labeled D-D' in FIG. 1 and further illustrates the quantum state of a single electron (e-) as the electron is transferred along a channel of via moveable quantum dots.

FIG. 1 illustrates a partial plan view of an embodiment of the quantum conveyor of a quantum chip. FIG. 2 is a cross-sectional view along the line labeled A-A' in FIG. 1. FIG. 3 is a plan view which shows a different level of detail for the region of the quantum conveyor included in the dashed box labeled 'B' in FIG. 1. FIG. 4 is a cross-sectional view along the line labeled C-C' in FIG. 3. FIG. 5 is a cross-sectional view along the line labeled D-D' in FIG. 1 and illustrates the quantum state of a single electron (e-) as the electron is transferred along a channel of via moveable quantum dots.

The quantum conveyor shown in FIGS. 1 through 5 includes a pair of screening gate electrodes 100, 102 in or on a semiconductor substrate 104 and that extend between a first stationary quantum dot 106 and a second stationary quantum dot 108. The first and second stationary quantum dots 106, 108 are part of an array of first quantum dots 106 and second quantum dots 108 and are defined (fixed) regions within the semiconductor substrate 104 where electrons can be trapped. The spin of the electrons define quantum information also referred to herein as qubits. The stationary quantum dots 106, 108 in each pair may be separated from one another by a relatively long distance, e.g., 1 μm, several μm, 10 s of μm or greater distance.

A channel 109 of moveable quantum dots between each pair of first and second stationary quantum dots 106, 108 is delimited by a corresponding pair of the screening gate electrodes 100, 102. Only one pair of first and second quantum dots 106, 108 and only one pair of screening gate electrodes 100, 102 is shown in FIG. 1 for ease of illustration. The quantum conveyor is defined by the array of gate electrodes 100, 102. The channel 109 of moveable quantum dots may be formed by the voltage scheme shown in FIG. 5 where the moveable dots are presently positioned at V1 which has the lowest potential. In the example of FIG. 5, the voltage scheme is implemented with 4-fold periodicity. However, this is just an example and other voltage periodicity schemes may be used to define the moveable quantum dots.

The channel 109 between each pair of first and second stationary quantum dots 106, 108 and delimited by a corresponding pair of screening gate electrodes 100, 102 is embedded in the semiconductor substrate 104. In one embodiment, the channel 109 is a one-dimensional electron gas (1DEG) and may have a length of about 1 um. For example, as shown in FIG. 4, the semiconductor substrate 104 may comprise a Si/SiGe material system. The Si/SiGe material system may include a base SiGe or Si substrate 110, a reduced-strain SiGe layer 112 on the base SiGe substrate 110, a second SiGe layer 114 formed on the reduced-strain SiGe layer 112, a strained Si quantum well layer 116 on the second SiGe layer 114, a third SiGe layer 118 on the strained Si quantum well layer 116, and a Si or SiGe capping layer 120 on the third SiGe layer 118. The material and strain differences between the different layers 112-120 yields a 1DEG channel 109 in the strained Si quantum well layer 116 and that is confined or delimited by a corresponding pair of the screening gate electrodes 100, 102. Other semiconductor material systems may be used to form a 1DEG channel between pairs of first and second stationary quantum dots 106, 108. For example, GaN, Ge/SiGe, GaAs, etc. may be used instead of a Si/SiGe material system.

Regardless of the specific type of semiconductor material system used, the screening gate electrodes 100, 102 may be disposed in trenches 122, 124 formed in the semiconductor substrate 104 as shown in FIG. 4, or instead formed on the semiconductor substrate 104. In either case, the screening gate electrodes 100, 102 are separated from the semiconductor substrate 104 by a first insulating layer 126 such as $SiO_2$, SiN, etc. or a Schottky gate.

The quantum conveyor also includes first planar transfer electrodes 128 above the semiconductor substrate 104 and that extend transverse (e.g., perpendicular) to the channel 109 running between pairs of the first and second stationary quantum dots 106, 108. The planar transfer electrodes 128 may be separated from the semiconductor substrate 104 by a second insulating layer 130 such as $SiO_2$, SiN, etc. The second insulating layer 130 is not shown in the plan view of FIGS. 1 and 3 to provide an unobstructed view of the underlying features.

The quantum conveyor further includes second planar transfer electrodes 132 laterally interleaved with the first planar transfer electrodes 128. In one embodiment, the second planar transfer electrodes 132 are laterally interleaved with the first planar transfer electrodes 128 at a pitch p2 which is half the pitch p1 of the first planar transfer electrodes 128. For example, p1 may be about 80 nm and p2 may be about 40 nm. Other pitches and pitch ratios may be used.

The first planar transfer electrodes 128 and the second planar transfer electrodes 132 are configured to transfer quantum information between each pair of first and second stationary quantum dots 106, 108 through the corresponding channel 109 of moveable quantum dots. More particularly, the screening gate electrodes 100, 102 are biased to confine the respective channels 109 by depleting the 1DEG outside the channels 109. The first and second planar transfer electrodes 128, 132 are biased so as to define moveable quantum dots 133 within the respective channels 109 in desired areas. An electron is moving in a moveable quantum dot 133, e.g., as shown in FIG. 5, where the moveable quantum dot 133 is dynamically defined by electrodes 128, 132. The transfer of quantum information via the movement of electrons using the moveable quantum dots 133 is also referred to herein as flying qubits. That is, a flying qubit refers to an electron and its corresponding spin as the electron is transferred using the moveable quantum dots 133. The dimension of the moveable quantum dots 133 may be in a range of 50 to 200 nm, for example.

In the voltage potential example shown in FIGS. 1 and 5, the first planar transfer electrodes 128 alternate between voltage V1 and voltage V3 and the second planar transfer electrodes 132 alternate between voltage V2 and voltage V4. Other voltage schemes may be used to transfer quantum information over the channel 109 of moveable quantum dots 133.

A moveable quantum dot 133 is realized between each interleaved instance of a first planar transfer electrode 128 and a second planar transfer electrode 132. For example, in FIG. 1, seven moveable quantum dots 133 are realized between each pair of first and second stationary quantum dots 106, 108. However, this is just an example. The quantum conveyor may have more or less than seven moveable quantum dots 133 between each pair of first and second stationary quantum dots 106, 108, by adjusting the corresponding number of first and second planar transfer electrodes 128, 132 accordingly. By proper control of the voltages applied to the first and second planar transfer electrodes 128, 132 coherent quantum state transfer can be realized by shuttling single electrons via the moveable quantum dots 133 while maintaining the spin state of the electron, as shown in FIG. 5.

The first and second transfer electrodes 128, 132 are 'planar' in that the top surfaces of the transfer electrodes 128, 132 are relatively planar with little to no surface roughness. In one embodiment, the second planar transfer electrodes 132 are coplanar with a hard mask 134 such as SiN formed on the first planar transfer electrodes 128.

Contact to the first and second planar transfer electrodes 128, 132 may be made at one or both ends of the quantum conveyor. For example, as shown in FIG. 2, one or both ends of the quantum conveyor may have a contact region 136 that does not include any channels 109. In a first part 138 of the contact region 136, the second planar transfer electrodes 132 and the hard mask 134 are removed and first contacts 140 are provided to the first planar transfer electrodes 128 the bottom and sidewalls of which may be covered by an insulating material 142 such as $SiO_2$, SiN, etc. Some of the first contacts 140 provide voltage V1 and alternate with other ones of the first contacts 140 which provide voltage V3, e.g., as shown in FIG. 1. The first contacts 140 which are at V1 potential are connected to a first overlying metal line or runner 144, whereas the first contacts 140 which are at V3 potential are connected to a second overlying metal line or runner 146 which is insulated from the first metal line/runner 144.

In a second part 148 of the contact region 136 of the quantum conveyor, second contacts 150 are formed on the hard mask 134 and contact the second planar transfer electrodes 132. Some of the second contacts 150 provide voltage V2 and alternate with other ones of the second contacts 150 which provide voltage V4, e.g., as shown in FIG. 1. The second contacts 150 which are at V2 potential are connected to a third overlying metal line or runner 152, whereas the second contacts 150 which are at V4 potential are connected to a fourth overlying metal line or runner 154. The metal lines/runners 144, 146, 152, 154 overlying the contacts 140, 150 are electrically insulated from one another to ensure the appropriate potentials are applied to the respective planar transfer electrodes 128, 132.

As shown in FIG. 1, the first contacts 140 may be arranged at least in first and second rows (V1, V3 potentials) that extend parallel with the channels 109. The first row (V1 potential) of first contacts 140 may be in in contact with even ones of the first planar transfer electrodes 128 whereas the second row (V3 potential) of first contacts 140 may be in contact with odd ones of the first planar transfer electrodes 128. The first contacts 140 in the first row (V1 potential) of first contacts 140 and the first contacts 140 in the second row (V3 potential) of first contacts 140 may be staggered with respect to one another, e.g., as shown in FIG. 1.

In a similar manner, the second contacts 150 may be arranged at least in first and second rows (V2 and V4 potentials) that extend parallel with the channels 109. The first row (V4 potential) of second contacts 150 may be in contact with even ones of the second planar transfer electrodes 132 whereas the second row (V2 potential) of second contacts 150 may be contact with odd ones of the second planar transfer electrodes 132. The second contacts 150 in the first row (V4 potential) of second contacts 150 and the second contacts 150 in the second row (V2 potential) of second contacts 150 may be staggered with respect to one another. However, the first and second contacts 140, 150 of the quantum conveyor may be arranged in a different manner.

FIGS. 6A through 6F illustrate an embodiment of producing the quantum conveyor according to which the first planar transfer electrodes 128 are formed via a lithography process and the second planar transfer electrodes 132 are formed via a self-aligned damascene process. The screening gate electrodes 100, 102 and details of the semiconductor substrate 104 are not shown in FIGS. 6A through 6F to emphasize formation of the first and second planar transfer electrodes 128, 132.

As explained above, the screening gate electrodes 100, 102 may be disposed in trenches 122, 124 formed in the semiconductor substrate 104. In this case, the trenches 122, 124 may be etched into the semiconductor substrate 104 to a depth of, e.g., about 30 nm and then filled with just metal to yield Schottky screening gate electrodes 100, 102. In another option, the bottom and sidewalls of the trenches 122, 124 are first lined with an oxide 126 and then filled with metal. The trenches 122, 124 may have a spacing in a range of 80 to 150 nm, for example. In either case, the trench-based approach for the screening gate electrodes 100, 102 provides a planar surface before the critical gate electrode arrays are processed.

The screening gate electrodes 100, 102 instead may be formed on the semiconductor substrate 104 without trench etching. As with the trench option, the screening gate electrodes 100, 102 may form Schottky junctions with the semiconductor substrate 104 or instead be dielectrically insulated from the semiconductor substrate 104.

The gate pitch p1 between repeating ones of the first and second planar transfer electrodes 128, 132 for acceptable quantum dot definition is about 40 nm with a narrow spacing s1 of about 10 nm. The lithography and self-aligned damascene processes illustrated in FIGS. 6A through F ensure production of the first planar transfer electrodes 128 with a 2× pitch (p2) between the first planar transfer electrodes 128, followed by self-aligned production of the second planar transfer electrodes 132 which yields a pitch p2 of ½×p1 between repeating ones of the first and second planar transfer electrodes 128, 132.

Figure 6A:
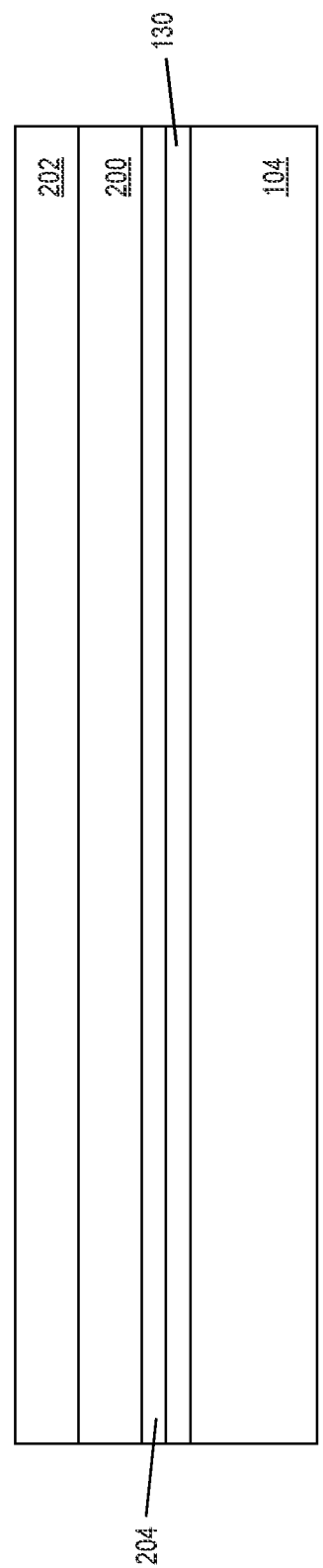
FIGS. 6A through 6F illustrate partial cross-sectional views of an embodiment of producing the quantum conveyor according to which first planar transfer electrodes of the quantum conveyor are formed via a lithography process and second planar transfer electrodes of the quantum conveyor are formed via a self-aligned damascene process.

FIG. 6A shows a general view of the semiconductor substrate 104 during the lithography process. The lithography process includes forming an insulating layer 130 over the semiconductor substrate 104, a first metal layer 200 over the insulating layer 130, and a hard mask layer 202 over the first metal layer 200. Any type of metal or metal alloy may be used for the first metal layer 200. For example, the first metal layer 200 may comprise W, Cu, Al, TiN, AlSiCu, etc. The first metal layer 200 may be very thin, e.g., 15, 20, 25 nm thick. In one embodiment, the insulating layer 130 is formed by atomic layer deposition. However, other oxide deposition methods may be used to form the insulating layer 130, e.g., such as CVD (chemical vapor deposition), oxidation, etc.

Figure 6B:
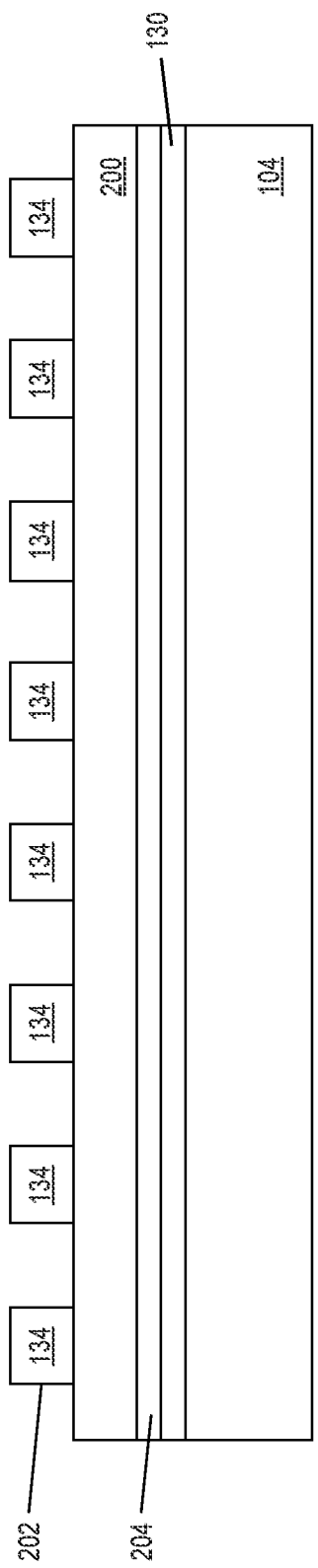

FIG. 6B shows the hard mask layer 202 after lithographic patterning to form the hard mask 134 that defines lines of the first metal layer 200. In one embodiment, the hard mask layer 202 is patterned by electron beam (e-beam) lithography and then etched to form the hard mask 134. E-beam lithography may yield line widths of about 30 nm with a spacing of about 50 nm for an overall pitch p1 of about 80 nm between repeating ones of the first planar transfer electrodes 128. The subsequent self-aligned process used to form the second planar transfer electrodes 132 yields a pitch p2 of about 40 nm in this example between repeating ones of the first and second planar transfer electrodes 128, 132, thus allowing e-beam lithography to be used while meeting the small pitch requirements for acceptable quantum dot definition. The etching of the hard mask layer 202 may stop at or in the underlying insulating layer 130. Other processes may be used to lithographically pattern the hard mask layer 202 such as dry ArF, extreme ultraviolet lithography (EUV), etc. The lines of the first metal layer 200 defined by the hard mask 134 correspond to positions of the first planar transfer electrodes 128.

Figure 6C:
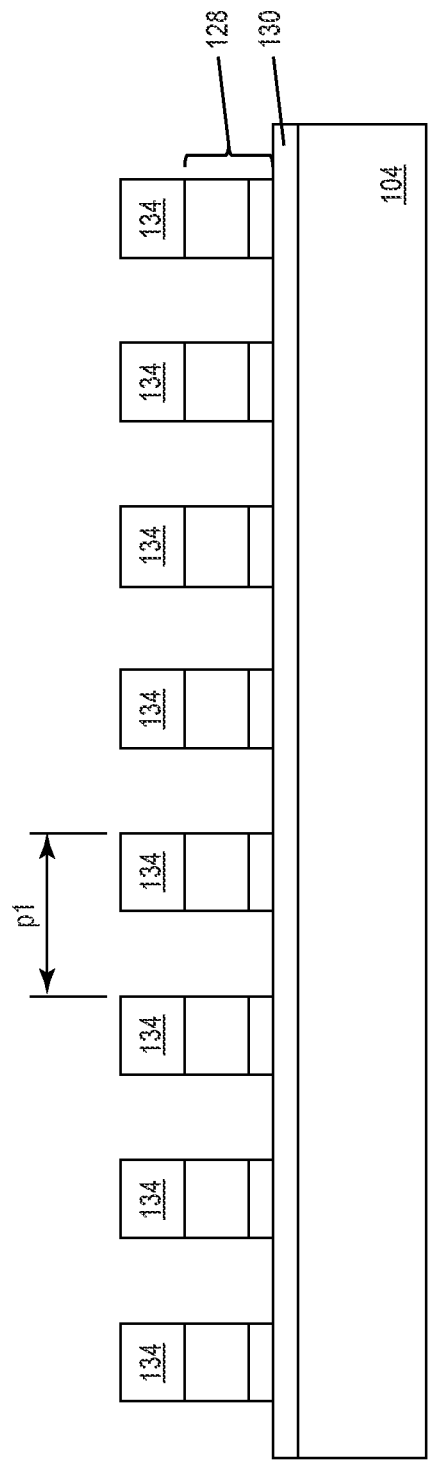

FIG. 6C shows, with the hard mask 134 in place, the defined lines of the first metal layer 202 etched away to form the first planar transfer electrodes 128 at first pitch p1. As shown in FIGS. 6A through 6C, before forming the first metal layer 200, a liner layer 204 may be formed on the lower insulating layer 130 so that the liner layer 204 is interposed between the first metal layer 200 and the lower insulating layer 130. According to this embodiment, the etching of the first metal layer 202 at least partially removes the liner layer 204 where uncovered by the hard mask 134 such that unetched sections of the liner layer 204 form part of the first planar transfer electrodes 128. The liner layer 204 instead may be omitted, with an etch stop in insulating layer 130 and a strip of the remaining oxide followed by regrowth for a second gate oxide.

Figure 6D:
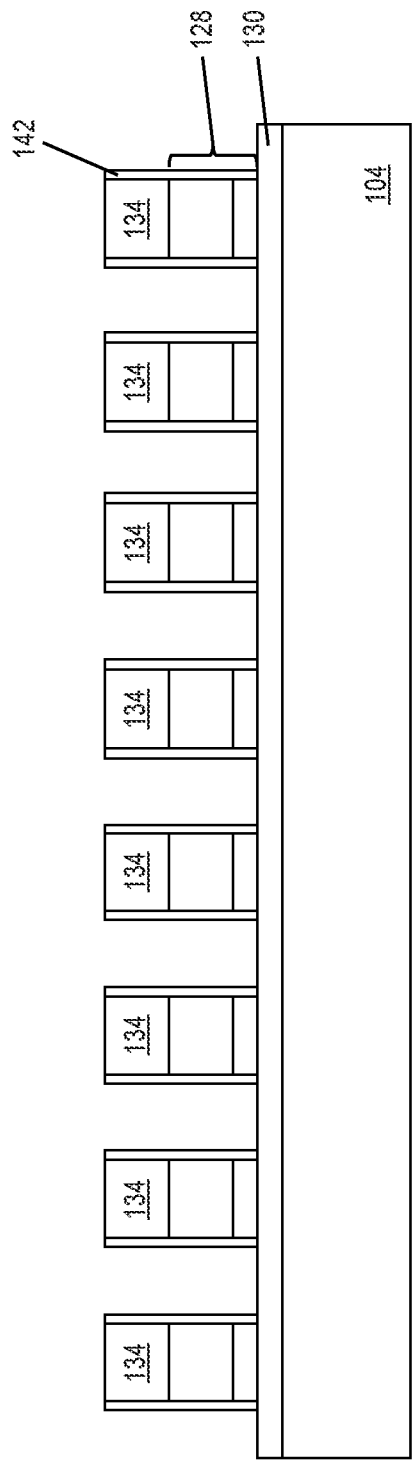

FIG. 6D shows part of the self-aligned damascene process for forming the second planar transfer electrodes 132. With the hard mask 134 in place, the first planar transfer electrodes 128 are lined with a second insulating layer 142. In one embodiment, the second insulating layer 142 is formed by atomic layer deposition. However, other oxide deposition methods may be used to form the second insulating layer 142, e.g., such as CVD (chemical vapor deposition), oxidation, etc.

Figure 6E:
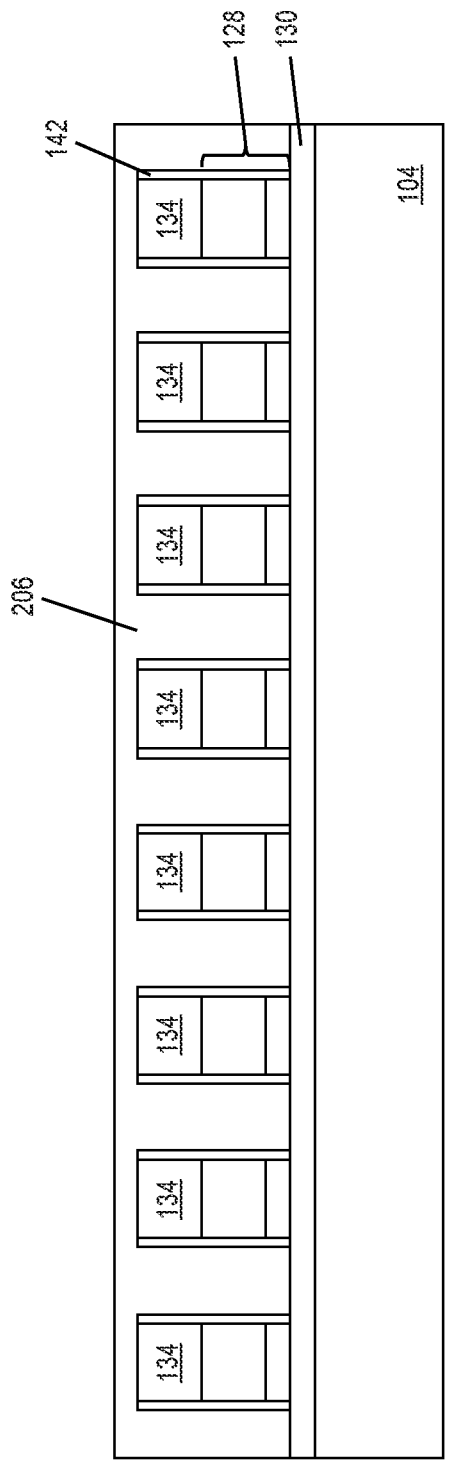

FIG. 6E shows a second metal layer 206 formed over the second insulating layer 142. The second metal layer 206 fills lateral spaces between adjacent ones of the first planar transfer electrodes 128. Any type of metal or metal alloy may be used for the second metal layer 206. For example, the second metal layer 206 may comprise W, Cu, Al, TiN, AlSiCu, etc.

Figure 6F:
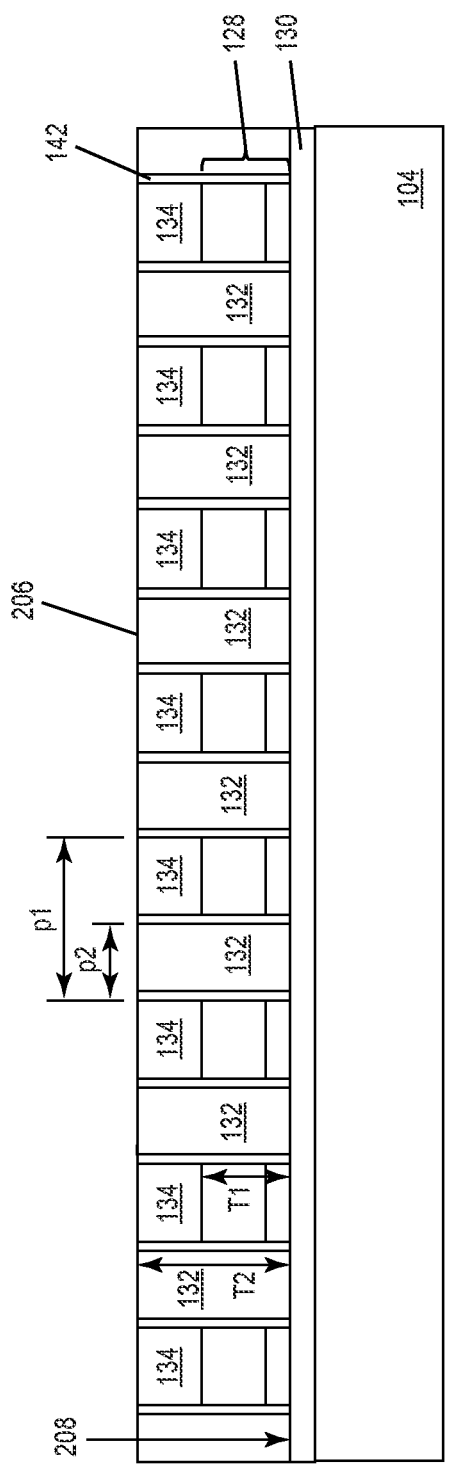

FIG. 6F shows the second metal layer 206 after planarizing the second metal layer 206 to form the second planar transfer electrodes 132. The second planar transfer electrodes 132 are laterally interleaved with the first planar transfer electrodes 128 at a second pitch p2 less than the first pitch p1. Any planarization technique may be used, e.g., such as grinding, chemical-mechanical polishing (CMP), etc. In one embodiment, the planarizing of the second metal layer 206 stops on the hard mask 134 such that the second planar transfer electrodes 132 and the hard mask 134 terminate in the same plane and the second planar transfer electrodes 132 are thicker (T2>T1) than the first planar transfer electrodes 128 as measured in a direction perpendicular to a surface 208 of the semiconductor substrate 104 over which the second planar transfer electrodes 132 and the first planar transfer electrodes 128 are formed.

Figure 7A:
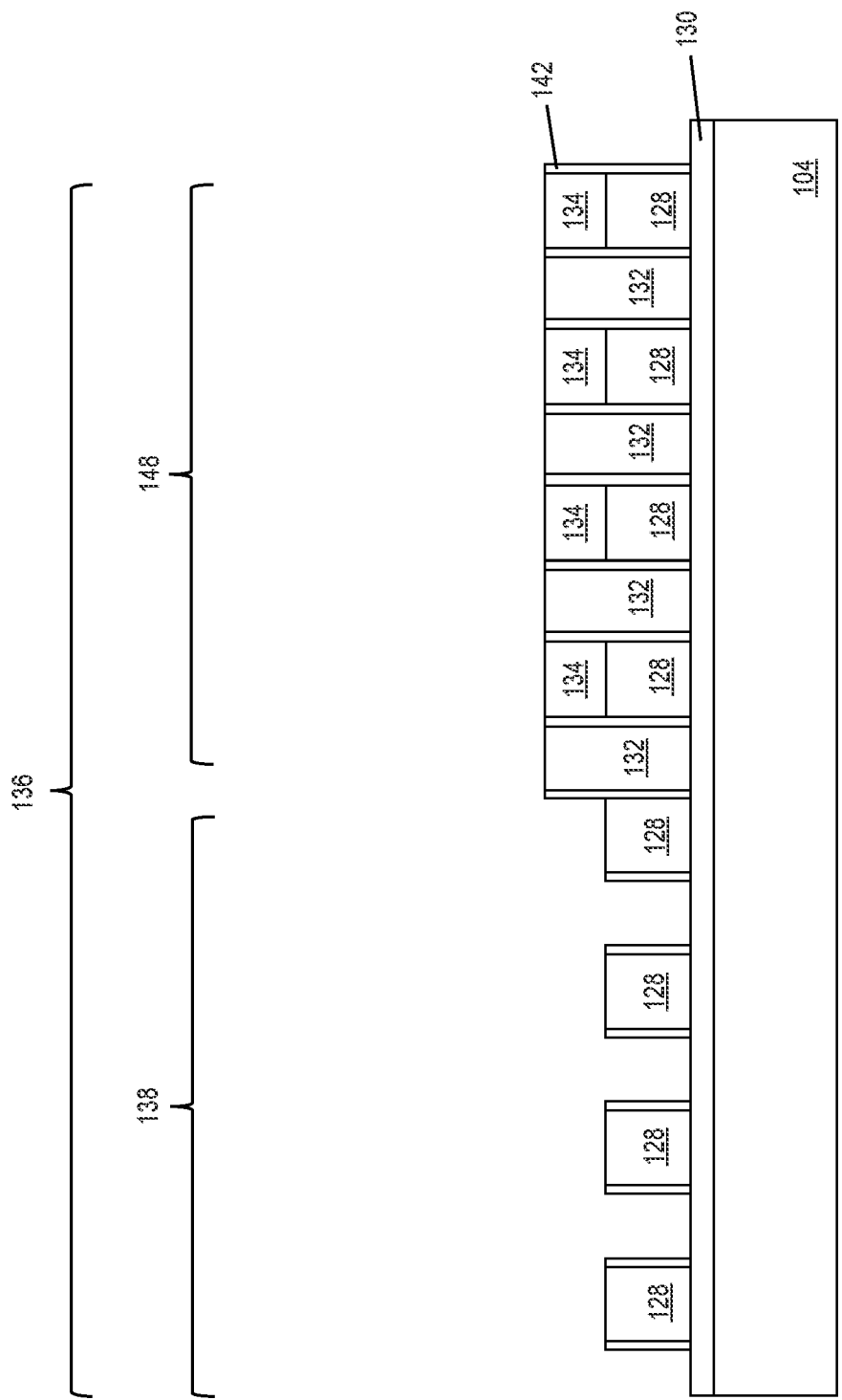
FIGS. 7A and 7B illustrate partial cross-sectional views of an embodiment of forming contacts to planar transfer electrodes in a contact region of the quantum conveyor.
Figure 7B:
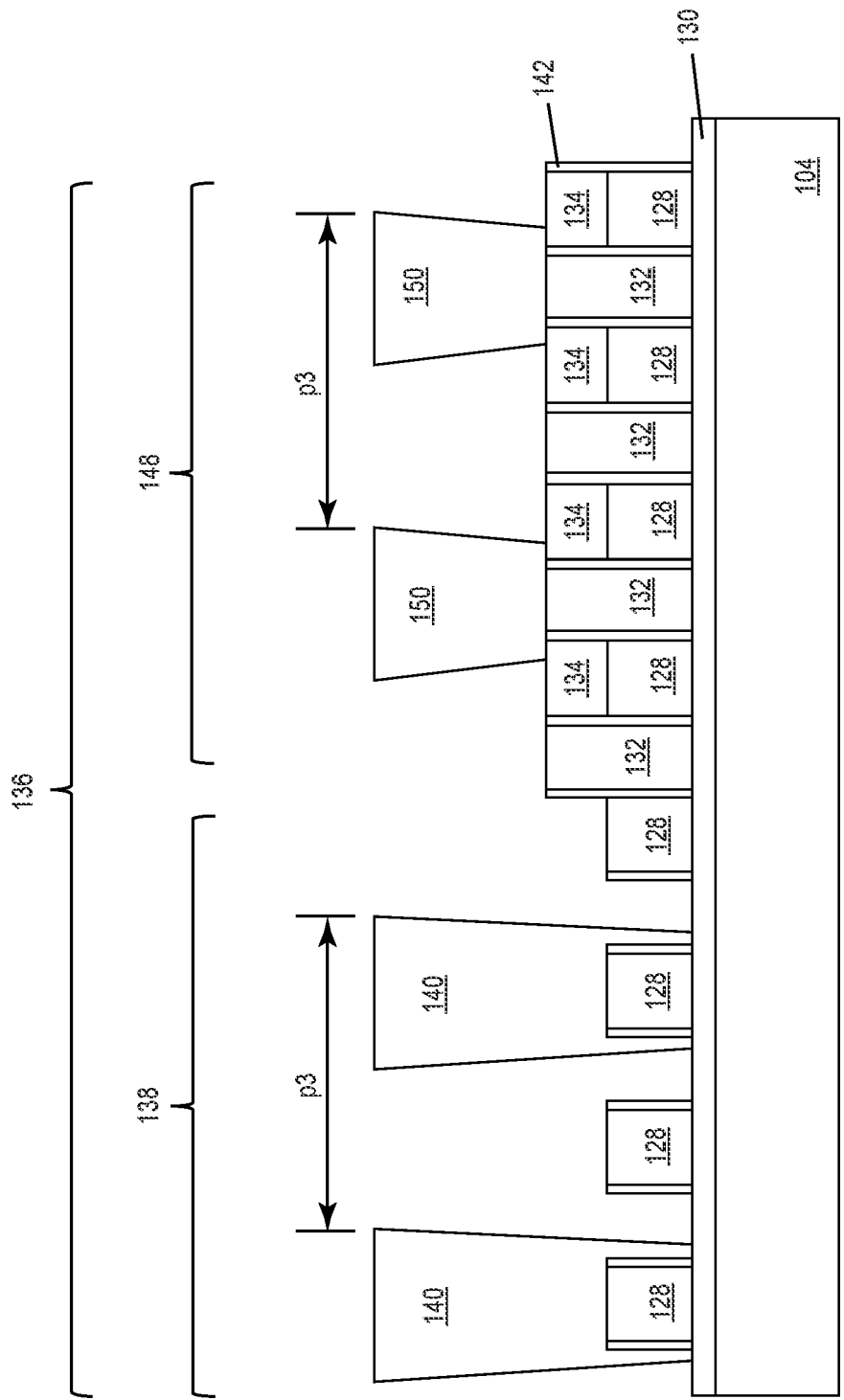

FIGS. 7A and 7B illustrate an embodiment of forming the first contacts 140 to the first planar transfer electrodes 128 and the second contacts 150 to the second planar transfer electrodes 132 in the contact region 136 of the quantum conveyor.

FIG. 7A shows the same arrangement of first and second planar transfer electrodes 128, 132 as in FIG. 6F, but in the contact region 136 of the quantum conveyor which does not include the channels 109 of moveable quantum dots 133. In the first part 138 of the contact region 136 of the quantum conveyor that does not include the channels 109, the second planar transfer electrodes 132 and the hard mask 134 are removed. The second planar transfer electrodes 132 and the hard mask 134 may be removed in first part 138 of the contact region 136 of the quantum conveyor by a masked etching process.

FIG. 7B shows the first contacts 140 formed in contact with the first planar transfer electrodes 128 in the first part 138 of the contact region 136 of the quantum conveyor and the second contacts 150 formed on the hard mask 134 and in contact with the second planar transfer electrodes 132 in the second part 148 of the contact region 136 of the quantum conveyor. The first and second contacts 140, 150 may be formed by metal deposition and subsequent planarization such as CMP, grinding, etc. The first and second contacts 140, 150 may have relaxed dimension compared to the pitches p1, p2 associated with the first and second planar transfer electrodes 128, 132. For example, the first and second contacts 140, 150 may have a diameter in a range of 80 to 90 nm and a pitch p3 of 4×p1 or larger. In the case of p1 being about 40 nm, p3 would be about 160 nm in this example. Any type of metal or metal alloy may be used for the contacts 140, 150. For example, the contacts 140, 150 may comprise W, Cu, Al, TiN, AlSiCu, etc.

FIGS. 8A through 8D illustrate another embodiment of forming the first contacts 140 to the first planar transfer electrodes 128 in the first part 138 of the contact region 136 of the quantum conveyor.

FIG. 8A shows, after removing the second planar transfer electrodes 132 and the hard mask 134 in the first part 138 of the contact region 136 of the quantum conveyor, forming an interlayer dielectric layer 300 formed over the quantum conveyor. The interlayer dielectric layer 300 may be, e.g., $SiO_2$, SiN, etc.

Figure 8B:
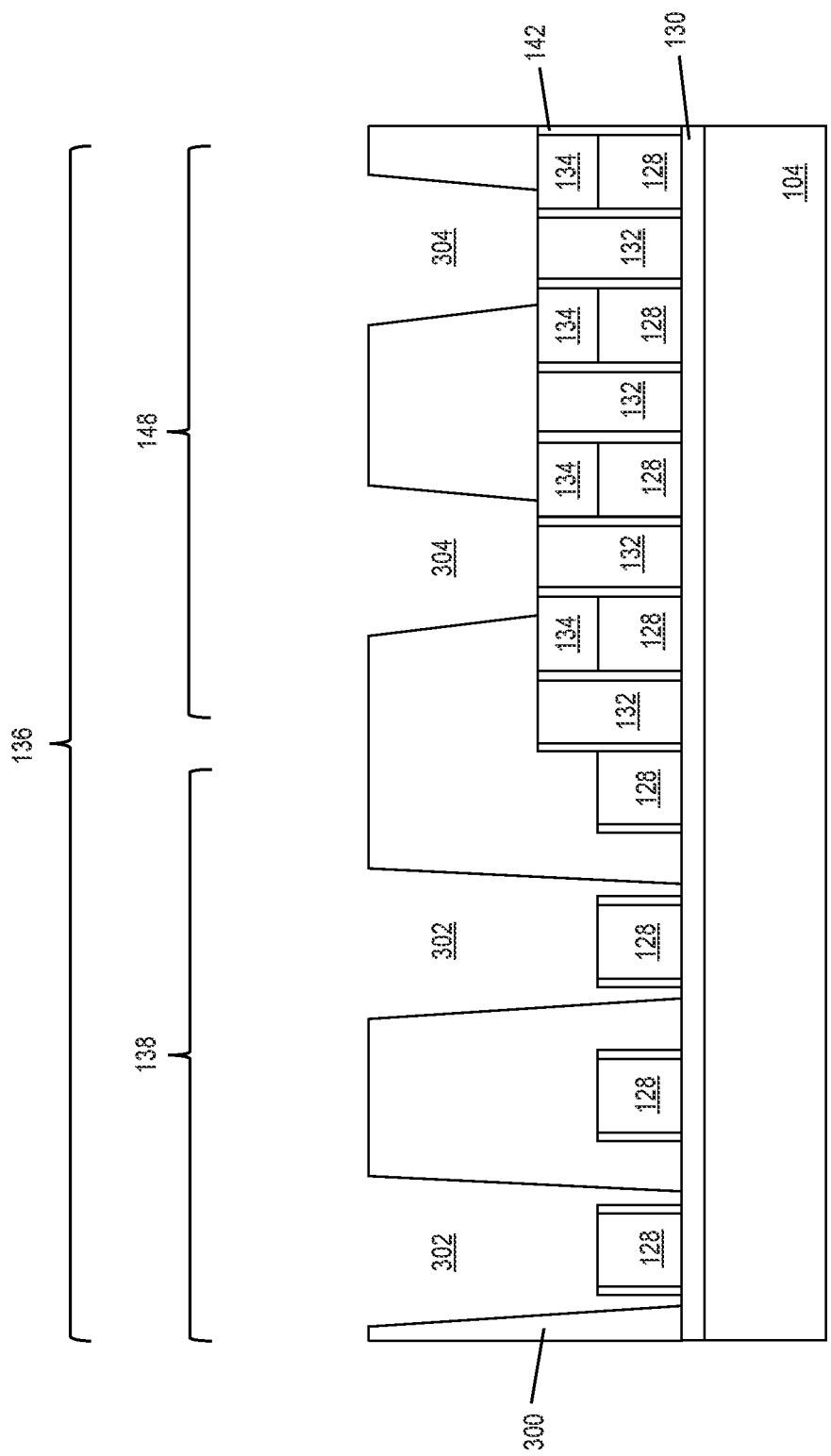

FIG. 8B shows first openings 302 formed in the interlayer dielectric layer 300 that expose the first planar transfer electrodes 128 in the first part 138 of the contact region 136 of the quantum conveyor, and second openings 304 formed in the interlayer dielectric layer 300 that expose the second planar transfer electrodes 132 in the second part 148 of the contact region 136 of the quantum conveyor. The first and second openings 302, 304 in the interlayer dielectric layer 300 may be formed by masked etching of the interlayer dielectric layer 300.

Figure 8C:
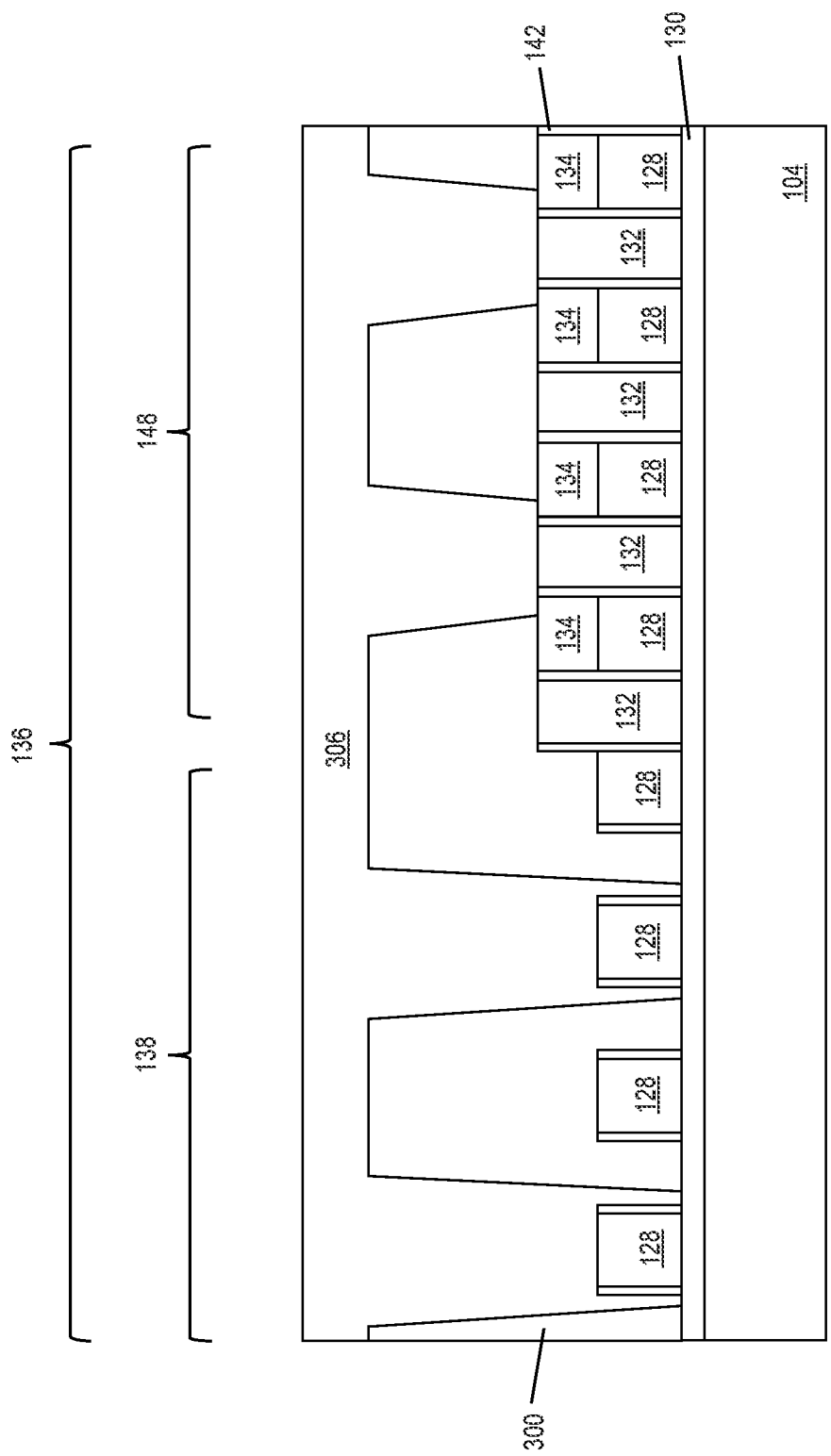

FIG. 8C shows filling the first openings 302 and the second openings 304 in the interlayer dielectric layer 300 with an electrically conductive material 306. Any type of metal or metal alloy may be used for the electrically conductive material 306. For example, the electrically conductive material 306 may be W, Cu, Al, TiN, AlSiCu, etc.

Figure 8D:
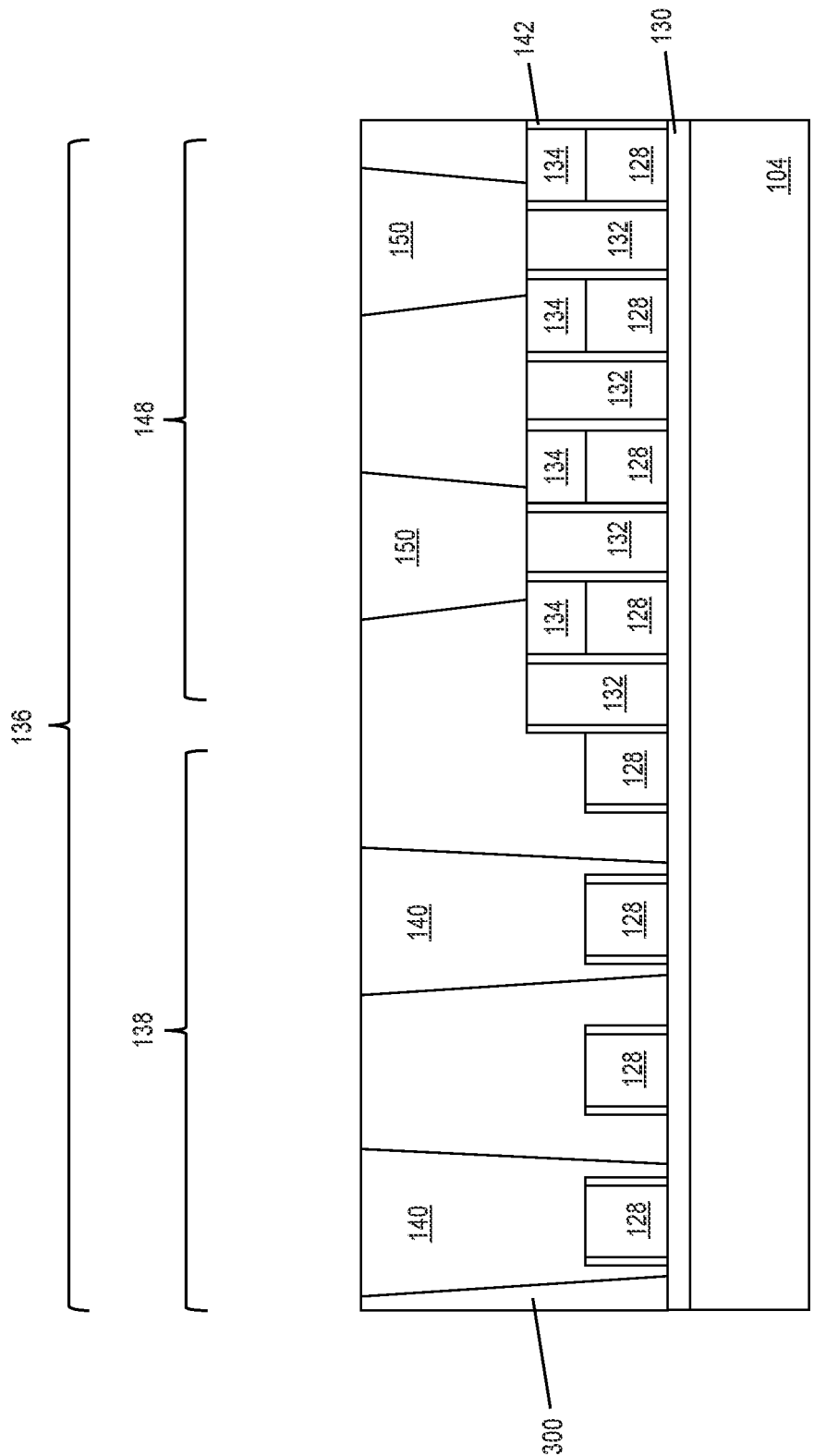

FIG. 8D shows the electrically conductive material 306 after planarization. Any planarization technique may be used, e.g., such as chemical-mechanical polishing (CMP). The planarization process may stop on the interlayer dielectric layer 300. The remaining electrically conductive material 306 forms the first contacts 140 to the first planar transfer electrodes 128 in the first part 138 of the contact region 136 of the quantum conveyor and the second contacts 150 to the second planar transfer electrodes 132 in the second part 148 of the contact region 136. As previously explained herein, the second contacts 150 may be arranged at least in first and second rows that extend parallel with the channels 109 of moveable quantum dots 133, the first row of second contacts 150 may be in contact with even ones of the second planar transfer electrodes 132, and the second row of second contacts 150 may be in contact with odd ones of the second planar transfer electrodes 132.

Although the present disclosure is not so limited, the following numbered examples demonstrate one or more aspects of the disclosure.

Example 1

A method of producing a quantum conveyor, the method comprising: forming a pair of screening gate electrodes in or on a semiconductor substrate and that extend between a first stationary quantum dot and a second stationary quantum dot, the pair of screening gate electrodes configured to delimit a channel of moveable quantum dots between the first stationary quantum dot and the second stationary quantum dot; forming, via a lithography process, a plurality of first planar transfer electrodes above the semiconductor substrate and that extend transverse to the channel of moveable quantum dots; and forming, via a self-aligned damascene process, a plurality of second planar transfer electrodes laterally interleaved with the first planar transfer electrodes, wherein the first planar transfer electrodes and the second planar transfer electrodes are configured to transfer quantum information between the first stationary quantum dot and the second stationary quantum dot through the channel of moveable quantum dots.

Example 2

The method of example 1, wherein the second planar transfer electrodes are laterally interleaved with the first planar transfer electrodes at a pitch that is half a pitch of the first planar transfer electrodes.

Example 3

The method of example 1 or 2, wherein the lithography process comprises: forming a first insulating layer over the semiconductor substrate, a first metal layer over the first insulating layer, and a hard mask layer over the first metal layer; lithographically patterning the hard mask layer to form a hard mask that defines lines of the first metal layer; and with the hard mask in place, etching away the defined lines of the first metal layer to form the first planar transfer electrodes at a first pitch.

Example 4

The method of example 3, wherein the first insulating layer is formed by atomic layer deposition.

Example 5

The method of example 3 or 4, further comprising: before forming the first metal layer, forming a first liner layer on the first insulating layer so that the first liner layer is interposed between the first metal layer and the first insulating layer, wherein the etching at least partially removes the first liner layer where uncovered by the hard mask such that unetched sections of the first liner layer form part of the first planar transfer electrodes.

Example 6

The method of any of examples 3 through 5, wherein the self-aligned damascene process comprises: with the hard mask in place, lining the first planar transfer electrodes with a second insulating layer; forming a second metal layer over the second insulating layer, the second metal layer filling lateral spaces between adjacent ones of the first planar transfer electrodes; and planarizing the second metal layer to form the second planar transfer electrodes such that the second planar transfer electrodes are laterally interleaved with the first planar transfer electrodes at a second pitch less than the first pitch.

Example 7

The method of example 6, wherein the second insulating layer is formed by atomic layer deposition.

Example 8

The method of example 6 or 7, wherein the planarizing of the second metal layer stops on the hard mask such that the second planar transfer electrodes and the hard mask terminate in the same plane and the second planar transfer electrodes are thicker than the first planar transfer electrodes as measured in a direction perpendicular to a surface over which the second planar transfer electrodes and the first planar transfer electrodes are formed.

Example 9

The method of any of examples 1 through 8, further comprising: forming first contacts to the first planar transfer electrodes and second contacts to the second planar transfer electrodes in a contact region of the quantum conveyor that does not include the channel of moveable quantum dots.

Example 10

A method of contacting a quantum conveyor that includes a pair of screening gate electrodes in or on a semiconductor substrate and configured to delimit a channel of moveable quantum dots between a first stationary quantum dot and a second stationary quantum dot, and first planar transfer electrodes laterally interleaved with second planar transfer electrodes above the semiconductor substrate and configured to transfer quantum information between the first stationary quantum dot and the second stationary quantum dot through the channel of moveable quantum dots, the second planar transfer electrodes being coplanar with a hard mask formed on the first planar transfer electrodes, the method comprising: in a first part of a contact region of the quantum conveyor that does not include the channel of moveable quantum dots, removing the second planar transfer electrodes and the hard mask and subsequently forming first contacts to the first planar transfer electrodes; and in a second part of the contact region of the quantum conveyor, forming second contacts on the hard mask and that contact the second planar transfer electrodes.

Example 11

The method of example 10, wherein forming the first contacts to the first planar transfer electrodes and the second contacts to the second planar transfer electrodes comprises: after removing the second planar transfer electrodes and the hard mask in the first part of the contact region of the quantum conveyor, forming an interlayer dielectric layer over the quantum conveyor; forming first openings in the interlayer dielectric layer that expose the first planar transfer electrodes in the first part of the contact region of the quantum conveyor, and second openings in the interlayer dielectric layer that expose the second planar transfer electrodes in the second part of the contact region of the quantum conveyor; filling the first openings and the second openings with an electrically conductive material; and planarizing the electrically conductive material.

Example 12

The method of example 10 or 11, wherein the first contacts are arranged at least in first and second rows that extend parallel with the channel of moveable quantum dots, wherein the first row of first contacts is in contact with even ones of the first planar transfer electrodes, and wherein the second row of first contacts is in contact with odd ones of the first planar transfer electrodes.

Example 13

The method of example 12, wherein the first contacts in the first row and the first contacts in the second row are staggered with respect to one another.

Example 14

The method of any of examples 10 through 13, wherein the second contacts are arranged at least in first and second rows that extend parallel with the channel of moveable quantum dots, wherein the first row of second contacts is in contact with even ones of the second planar transfer electrodes, and wherein the second row of second contacts is in contact with odd ones of the second planar transfer electrodes.

Example 15

The method of example 14, wherein the second contacts in the first row and the second contacts in the second row are staggered with respect to one another.

Example 16

A quantum conveyor, comprising: a pair of screening gate electrodes in or on a semiconductor substrate and that extend between a first stationary quantum dot and a second stationary quantum dot, the pair of screening gate electrodes configured to delimit a channel of moveable quantum dots between the first stationary quantum dot and the second stationary quantum dot; a plurality of first planar transfer electrodes above the semiconductor substrate and that extend transverse to the channel of moveable quantum dots; and a plurality of second planar transfer electrodes laterally interleaved with the first planar transfer electrodes, wherein the first planar transfer electrodes and the second planar transfer electrodes are configured to transfer quantum information between the first stationary quantum dot and the second stationary quantum dot through the channel of moveable quantum dots.

Example 17

The quantum conveyor of example 16, wherein the second planar transfer electrodes are laterally interleaved with the first planar transfer electrodes at a pitch that is half a pitch of the first planar transfer electrodes.

Example 18

A quantum conveyor, comprising: a pair of screening gate electrodes in or on a semiconductor substrate and configured to delimit a channel of moveable quantum dots between a first stationary quantum dot and a second stationary quantum dot; and first planar transfer electrodes laterally interleaved with second planar transfer electrodes above the semiconductor substrate and configured to transfer quantum information between the first stationary quantum dot and the second stationary quantum dot through the channel of moveable quantum dots, wherein the second planar transfer electrodes are coplanar with a hard mask formed on the first planar transfer electrodes, wherein in a first part of a contact region of the quantum conveyor that does not include the channel of moveable quantum dots, the second planar transfer electrodes and the hard mask are removed and first contacts are provided to the first planar transfer electrodes, wherein in a second part of the contact region of the quantum conveyor, second contacts are formed on the hard mask and contact the second planar transfer electrodes.

Example 19

The quantum conveyor of example 18, wherein the first contacts are arranged at least in first and second rows that extend parallel with the channel of moveable quantum dots, wherein the first row of first contacts is in contact with even ones of the first planar transfer electrodes, and wherein the second row of first contacts is in contact with odd ones of the first planar transfer electrodes.

Example 20

The quantum conveyor of example 18 or 19, wherein the second contacts are arranged at least in first and second rows that extend parallel with the channel of moveable quantum dots, wherein the first row of second contacts is in contact with even ones of the second planar transfer electrodes, and wherein the second row of second contacts is in contact with odd ones of the second planar transfer electrodes.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing a quantum conveyor, the method comprising:
    forming a pair of screening gate electrodes in or on a semiconductor substrate and that extend between a first stationary quantum dot and a second stationary quantum dot, the pair of screening gate electrodes configured to delimit a channel of moveable quantum dots between the first stationary quantum dot and the second stationary quantum dot;
    forming, via a lithography process, a plurality of first planar transfer electrodes above the semiconductor substrate and that extend transverse to the channel of moveable quantum dots; and
    forming, via a self-aligned damascene process, a plurality of second planar transfer electrodes laterally interleaved with the first planar transfer electrodes,
    wherein the first planar transfer electrodes and the second planar transfer electrodes are configured to transfer quantum information between the first stationary quantum dot and the second stationary quantum dot through the channel of moveable quantum dots.

2. The method of claim 1, wherein the second planar transfer electrodes are laterally interleaved with the first planar transfer electrodes at a pitch that is half a pitch of the first planar transfer electrodes.

3. The method of claim 1, wherein the lithography process comprises:
    forming a first insulating layer over the semiconductor substrate, a first metal layer over the first insulating layer, and a hard mask layer over the first metal layer;
    lithographically patterning the hard mask layer to form a hard mask that defines lines of the first metal layer; and
    with the hard mask in place, etching away the defined lines of the first metal layer to form the first planar transfer electrodes at a first pitch.

4. The method of claim 3, wherein the first insulating layer is formed by atomic layer deposition.

5. The method of claim 3, further comprising:
    before forming the first metal layer, forming a first liner layer on the first insulating layer so that the first liner layer is interposed between the first metal layer and the first insulating layer,
    wherein the etching at least partially removes the first liner layer where uncovered by the hard mask such that unetched sections of the first liner layer form part of the first planar transfer electrodes.

6. The method of claim 3, wherein the self-aligned damascene process comprises:
    with the hard mask in place, lining the first planar transfer electrodes with a second insulating layer;
    forming a second metal layer over the second insulating layer, the second metal layer filling lateral spaces between adjacent ones of the first planar transfer electrodes; and
    planarizing the second metal layer to form the second planar transfer electrodes such that the second planar transfer electrodes are laterally interleaved with the first planar transfer electrodes at a second pitch less than the first pitch.

7. The method of claim 6, wherein the second insulating layer is formed by atomic layer deposition.

8. The method of claim 6, wherein the planarizing of the second metal layer stops on the hard mask such that the second planar transfer electrodes and the hard mask terminate in the same plane and the second planar transfer electrodes are thicker than the first planar transfer electrodes as measured in a direction perpendicular to a surface over which the second planar transfer electrodes and the first planar transfer electrodes are formed.

9. The method of claim 1, further comprising:
forming first contacts to the first planar transfer electrodes and second contacts to the second planar transfer electrodes in a contact region of the quantum conveyor that does not include the channel of moveable quantum dots.

10. A method of contacting a quantum conveyor that includes a pair of screening gate electrodes in or on a semiconductor substrate and configured to delimit a channel of moveable quantum dots between a first stationary quantum dot and a second stationary quantum dot, and first planar transfer electrodes laterally interleaved with second planar transfer electrodes above the semiconductor substrate and configured to transfer quantum information between the first stationary quantum dot and the second stationary quantum dot through the channel of moveable quantum dots, the second planar transfer electrodes being coplanar with a hard mask formed on the first planar transfer electrodes, the method comprising:
in a first part of a contact region of the quantum conveyor that does not include the channel of moveable quantum dots, removing the second planar transfer electrodes and the hard mask and subsequently forming first contacts to the first planar transfer electrodes; and
in a second part of the contact region of the quantum conveyor, forming second contacts on the hard mask and that contact the second planar transfer electrodes.

11. The method of claim 10, wherein forming the first contacts to the first planar transfer electrodes and the second contacts to the second planar transfer electrodes comprises:
after removing the second planar transfer electrodes and the hard mask in the first part of the contact region of the quantum conveyor, forming an interlayer dielectric layer over the quantum conveyor;
forming first openings in the interlayer dielectric layer that expose the first planar transfer electrodes in the first part of the contact region of the quantum conveyor, and second openings in the interlayer dielectric layer that expose the second planar transfer electrodes in the second part of the contact region of the quantum conveyor;
filling the first openings and the second openings with an electrically conductive material; and
planarizing the electrically conductive material.

12. The method of claim 10, wherein the first contacts are arranged at least in first and second rows that extend parallel with the channel of moveable quantum dots, wherein the first row of first contacts is in contact with even ones of the first planar transfer electrodes, and wherein the second row of first contacts is in contact with odd ones of the first planar transfer electrodes.

13. The method of claim 12, wherein the first contacts in the first row and the first contacts in the second row are staggered with respect to one another.

14. The method of claim 10, wherein the second contacts are arranged at least in first and second rows that extend parallel with the channel of moveable quantum dots, wherein the first row of second contacts is in contact with even ones of the second planar transfer electrodes, and wherein the second row of second contacts is in contact with odd ones of the second planar transfer electrodes.

15. The method of claim 14, wherein the second contacts in the first row and the second contacts in the second row are staggered with respect to one another.

16. A quantum conveyor, comprising:
a pair of screening gate electrodes in or on a semiconductor substrate and that extend between a first stationary quantum dot and a second stationary quantum dot, the pair of screening gate electrodes configured to delimit a channel of moveable quantum dots between the first stationary quantum dot and the second stationary quantum dot;
a plurality of first planar transfer electrodes above the semiconductor substrate and that extend transverse to the channel of moveable quantum dots; and
a plurality of second planar transfer electrodes laterally interleaved with the first planar transfer electrodes,
wherein the first planar transfer electrodes and the second planar transfer electrodes are configured to transfer quantum information between the first stationary quantum dot and the second stationary quantum dot through the channel of moveable quantum dots.

17. The quantum conveyor of claim 16, wherein the second planar transfer electrodes are laterally interleaved with the first planar transfer electrodes at a pitch that is half a pitch of the first planar transfer electrodes.

18. A quantum conveyor, comprising:
a pair of screening gate electrodes in or on a semiconductor substrate and configured to delimit a channel of moveable quantum dots between a first stationary quantum dot and a second stationary quantum dot; and
first planar transfer electrodes laterally interleaved with second planar transfer electrodes above the semiconductor substrate and configured to transfer quantum information between the first stationary quantum dot and the second stationary quantum dot through the channel of moveable quantum dots,
wherein the second planar transfer electrodes are coplanar with a hard mask formed on the first planar transfer electrodes,
wherein in a first part of a contact region of the quantum conveyor that does not include the channel of moveable quantum dots, the second planar transfer electrodes and the hard mask are removed and first contacts are provided to the first planar transfer electrodes,
wherein in a second part of the contact region of the quantum conveyor, second contacts are formed on the hard mask and contact the second planar transfer electrodes.

19. The quantum conveyor of claim 18, wherein the first contacts are arranged at least in first and second rows that extend parallel with the channel of moveable quantum dots, wherein the first row of first contacts is in contact with even ones of the first planar transfer electrodes, and wherein the second row of first contacts is in contact with odd ones of the first planar transfer electrodes.

20. The quantum conveyor of claim 18, wherein the second contacts are arranged at least in first and second rows that extend parallel with the channel of moveable quantum dots, wherein the first row of second contacts is in contact with even ones of the second planar transfer electrodes, and wherein the second row of second contacts is in contact with odd ones of the second planar transfer electrodes.

\* \* \* \* \*